(12) United States Patent
Flourens et al.

(10) Patent No.: US 10,951,019 B2
(45) Date of Patent: Mar. 16, 2021

(54) ELECTRICAL LINK COMPRISING AN ELECTRICAL PROTECTION DEVICE—VOLTAGE BIAS

(71) Applicant: AIRBUS OPERATIONS (SAS), Toulouse (FR)

(72) Inventors: Franck Flourens, Toulouse (FR); Christian Donadille, Castanet-Tolosan (FR); Patrick Oms, Colomiers (FR)

(73) Assignee: AIRBUS OPERATIONS (SAS), Toulouse (FR)

( * ) Notice: Subject to any disclaimer, the term of this patent is extended or adjusted under 35 U.S.C. 154(b) by 398 days.

(21) Appl. No.: 15/969,268

(22) Filed: May 2, 2018

(65) Prior Publication Data
US 2018/0323603 A1    Nov. 8, 2018

(30) Foreign Application Priority Data

May 3, 2017    (FR) ...................................... 1753868

(51) Int. Cl.
| | |
|---|---|
| *H02H 3/00* | (2006.01) |
| *H02H 3/20* | (2006.01) |
| *H02H 9/02* | (2006.01) |
| *H02H 1/00* | (2006.01) |
| *H03K 5/24* | (2006.01) |
| *H02H 5/10* | (2006.01) |
| *H02H 3/17* | (2006.01) |

(Continued)

(52) U.S. Cl.
CPC ........... *H02H 3/202* (2013.01); *G01R 31/008* (2013.01); *G01R 31/50* (2020.01); *H02H 1/0007* (2013.01); *H02H 3/17* (2013.01); *H02H 5/10* (2013.01); *H02H 9/02* (2013.01); *H03K 5/24* (2013.01)

(58) Field of Classification Search
None
See application file for complete search history.

(56) References Cited

U.S. PATENT DOCUMENTS 4,667,263 A * 5/1987 Morris ................ H01H 71/123
                                                                  29/622
6,218,647 B1    4/2001 Jones
(Continued)

FOREIGN PATENT DOCUMENTS

FR    2 973 884    10/2012

OTHER PUBLICATIONS

Search Report for FR 1753868, dated Mar. 26, 2018, 1 page.

*Primary Examiner* — Stephen W Jackson
(74) *Attorney, Agent, or Firm* — Nixon & Vanderhye P.C.

(57) ABSTRACT

An electrical link (290) configured to link a DC high-voltage power source (270) to a user apparatus (250), and includes an electrical conductor (240) surrounded by an insulating cover and an electrical protection device (200) including: a conductive sleeve (280) arranged around the insulating cover, a biasing module (245) configured to voltage-bias the conductive sleeve (280), a circuit breaker (210) arranged on the conductor (240) and configured to cut off a current transiting through the conductor (240), and a detection module (220) connected to the conductive sleeve (280) and configured to detect a current leak out of the conductor (240) and to command the circuit breaker (210) on the basis of the detection. The invention also relates to a method for the secure supply of electric power.

8 Claims, 6 Drawing Sheets

(51) Int. Cl.
G01R 31/00 (2006.01)
G01R 31/50 (2020.01)

(56) References Cited

U.S. PATENT DOCUMENTS 6,515,564 B2 * 2/2003 Leopold ............. H01H 71/0207
335/18
2012/0256637 A1 10/2012 Juhlin

* cited by examiner

ELECTRICAL LINK COMPRISING AN ELECTRICAL PROTECTION DEVICE—VOLTAGE BIAS

RELATED APPLICATION

This application claims priority to French Patent Application 1753868 filed May 3, 2017, the entirety of which is incorporated by reference.

TECHNICAL FIELD

The present invention relates to an electrical link for the transmission of a DC high voltage (HV) to a user apparatus, the link comprising an electrical protection device for supplying electric power in a secure manner. The invention also relates to a method for the secure supply of electric power to a user apparatus in a vehicle via the electrical link.

BACKGROUND OF THE INVENTION

An electrical installation on an aircraft conventionally comprises an electric power source linked to a user apparatus to provide power to the user apparatus. The electrical installation includes an electrical link formed of an electrical conductor covered with an insulating cover. The electrical link further comprises a circuit breaker device for monitoring parameters of the electrical signal transiting through the link between the power source and the user apparatus and interrupting an overload current or a short-circuit current in the conductor.

Electric power consumed on aircraft has been increasing due to increasing power demands of electrically powered user devices. This trend inevitably leads to an increase in the voltage levels of the electric power supply systems on aircraft, which were traditionally 115 volts AC (AC for alternating current) and 28 volts DC (DC for direct current).

Voltages of the order of +/−270 volts DC, +/−540 volts DC are nowadays contemplated. These high voltage values give rise to new problems on aircraft. For example, series or parallel electric arcs may occur when current leaks from the electrical link. A parallel arc between an electrical conductor supplying power to an apparatus and the conductive structure of an aircraft, or between two adjacent electrical conductors, could damage the user apparatus.

Prior art circuit breaker devices are not optimized for securing the transmission of power via the electrical links of installations using high voltages. Specifically, at high voltages, with prior art circuit breakers, it is mandatory to comply with large safety distances between a strand containing power supply cables and the airframe of the aircraft, or between a strand containing power supply cables and another strand containing cables for data transmission, in order to prevent a possible electric arc in the strand containing power supply cables from damaging the conductive structure of the aircraft, or the strand containing cables for data transmission, through a thermal effect. These safety obligations generate large spatial constraints in an aircraft.

DISCLOSURE OF THE INVENTION

There is a need for a device for the electrical protection of an electrical link that provides a secure supply of high-voltage electric power to a user apparatus in a vehicle and that completely or partly overcomes the drawback of the prior art mentioned above. To this end, the invention relates to an electrical link designed to link a DC high-voltage power source to a user apparatus, the electrical link comprising an electrical conductor surrounded by an insulating cover, the electrical link comprising an electrical protection device comprising:

a conductive sleeve arranged around the insulating cover, a biasing module configured to voltage-bias the conductive sleeve, a circuit breaker arranged on the conductor and configured to interrupt a current flowing through the conductor, and a detection module connected to the conductive sleeve and configured to detect a current leak at the conductor and to command the circuit breaker to interrupt the current.

The invention also relates to a method for the secure supply of electric power to a user apparatus in a vehicle via an electrical link linking the user apparatus to a power source supplying a DC voltage, the electrical link comprising:

an electrical conductor surrounded by an insulating cover;
an electrical protection device comprising:
a conductive sleeve arranged around the insulating cover;
a biasing module configured to voltage-bias the conductive sleeve;
a circuit breaker arranged on the conductor and configured to interrupt a current in the conductor; and
a detection module comprising a comparator whose first input is connected to the conductive sleeve and whose second input is connected to a DC voltage generator supplying a reference voltage, and a microcontroller connected between an output of the comparator and the circuit breaker, the microcontroller being configured to send a command signal to the circuit breaker on the basis of an output signal received from the comparator.

The method may comprise the following successive steps:

injection, by the biasing module, of a DC voltage into the conductive sleeve;

comparison, by the comparator, of a voltage on the conductive sleeve with the reference voltage;

monitoring, by the microcontroller, of the state of the output signal of the comparator, said state being either a first state indicative of a current leak out of the electrical conductor or a second state indicative of no current leak;

activation of the circuit breaker to interrupt current by the microcontroller if the output signal of the comparator is in the first state.

The present invention thus makes it possible to secure the transmission of power via the electrical links of installations using high voltages by reducing the distance constraints between an electrical link and the frame of the vehicle or between two electrical links.

BRIEF DESCRIPTION OF THE DRAWINGS

The abovementioned features of the invention, as well as others, will become more clearly apparent upon reading the following description of exemplary embodiments. The description is given with reference to the appended drawings, in which.

DETAILED DISCLOSURE OF EMBODIMENTS OF INVENTION

Figure 1:
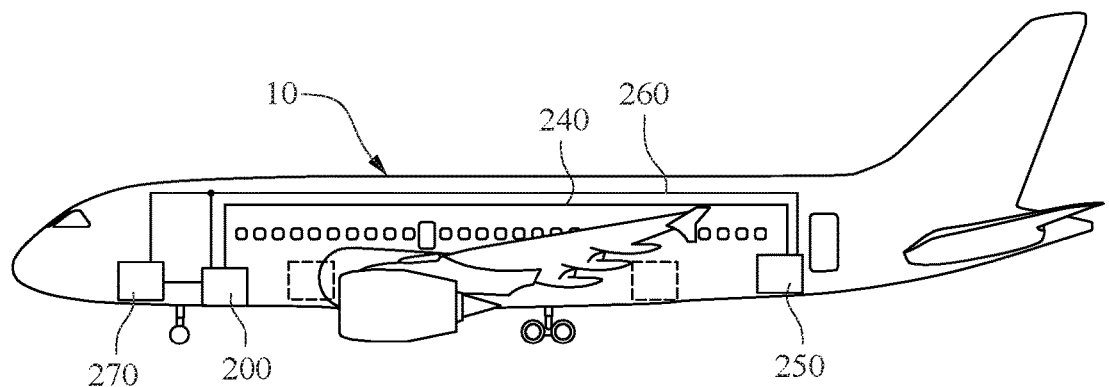
FIG. 1 shows an aircraft including an electrical installation having a power source connected to a user apparatus via an electrical link, a current return line and a device for the electrical protection of the electrical link.

FIG. 1 shows an aircraft 10 that includes an electrical installation having a high-voltage electric power source 270, e.g. DC power source, connected to a user apparatus 250 via an electrical link 290 comprising an electrical protection device 200 associated with the electrical link 290.

The electric power source 270 is furthermore linked to the user apparatus 250 by a current return line 260.

The high-voltage electric power source 270 supplies a DC high-voltage HV of the order of +/−270 volts DC, +/−540 volts DC or some other level of DC voltage. A high DC voltage may be a voltage of at least 220 volts.

The aircraft 10 furthermore comprises a conductive structure (not shown) that is formed by any metal/conductive element of the aircraft that is at a reference potential and forms an electrical ground voltage level.

Figure 2:
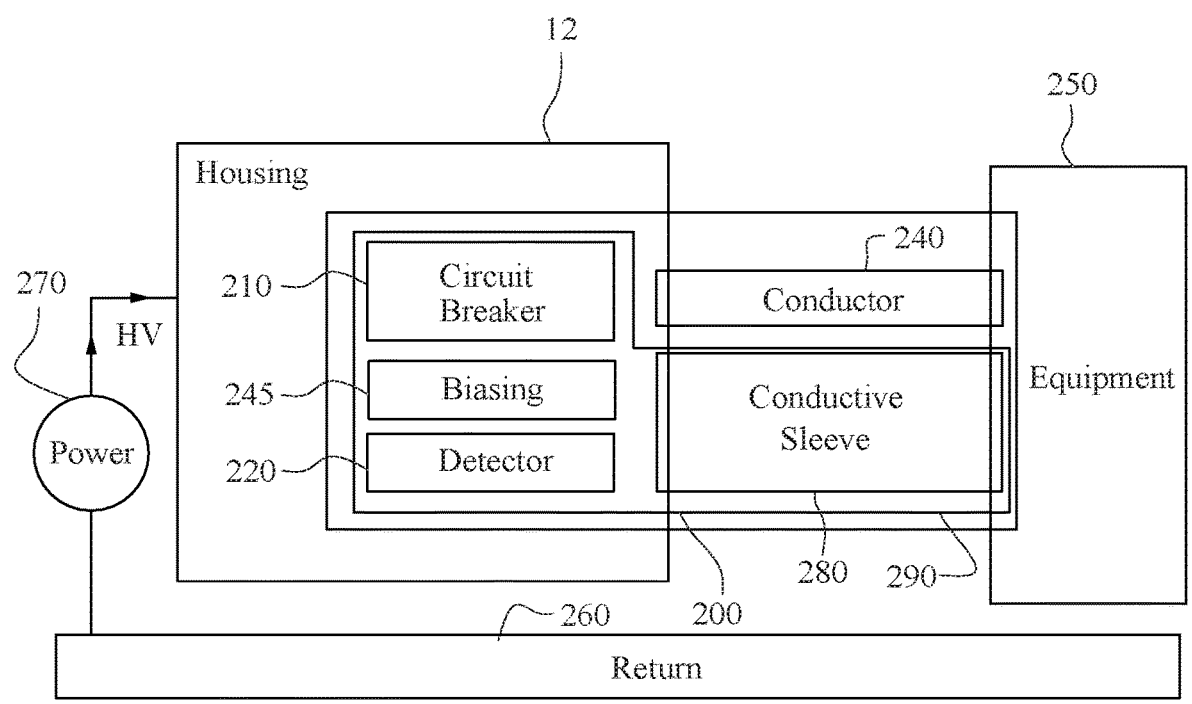
FIG. 2 shows a block diagram of the electrical installation shown in FIG. 1, and a depiction of the device for the electrical protection of the electrical link.
Figure 3:
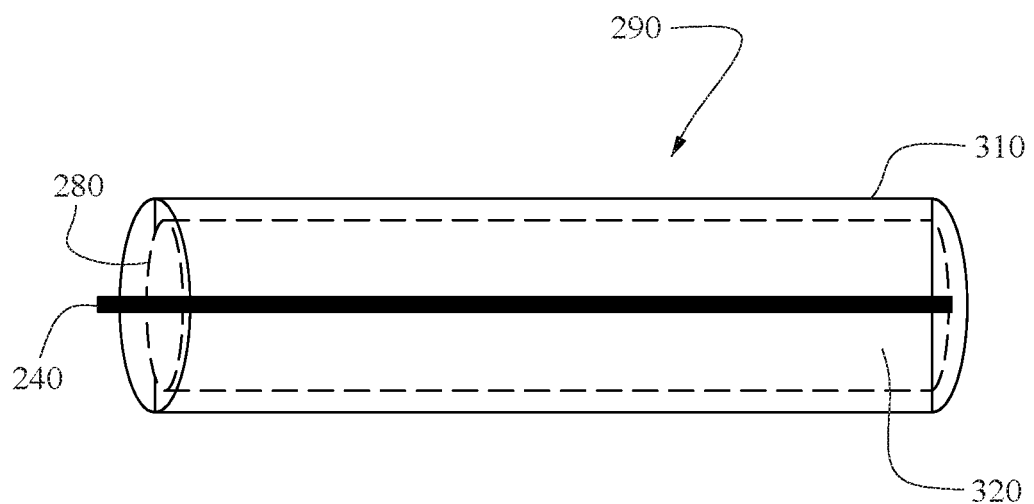
FIG. 3 shows a schematic view of a conductive sleeve arranged on an electrical link and forming part of the electrical protection device.

FIGS. 2 and 3 show the electrical link 290 comprising an electrical conductor 240 surrounded by an insulating cover 320 (for example a plastic sleeve) and the electrical protection device 200 which comprises a part arranged on the insulating cover 320 of the conductor 240, and a part formed of electronic devices that are for example arranged in a secure housing 12.

The part arranged on the insulating cover 320 comprises a conductive sleeve 280 surrounded by an insulating cover 310. The conductive sleeve 280 surrounds the insulating cover 320 of the conductor 240.

The part situated in the housing 12 (see FIG. 2) comprises:

a circuit breaker 210 connected to the electric power source 270. When the circuit breaker is commanded to interrupt current, it opens the electrical link to interrupt the supply of the high voltage (HV) to the user apparatus 250 via the electrical conductor 240. In a known manner, the circuit breaker 210 operates as a switch that, when it is activated (commanded), opens and thus shuts off the electrical conductor 240;

a biasing module 245 for voltage-biasing the conductive sleeve 280; and a detection module 220 for detecting a current leak at the electrical conductor 240.

A current leak occurs when the electrical link 290 is damaged. For example, a current leak occurs upon contact of the conductor 240 with the conductive sleeve 280 when the insulating cover 320 is damaged or contact of the conductor 240 with an element external to the electrical link when the two insulating covers 310 and 320 are damaged. A current leak may lead to electric arcs between the conductor 240 and the conductive structure of the aircraft 10 or with another conductor set to a potential different from the conductor or with the current return line 260 if the latter is at a potential different from ground.

Figure 4:
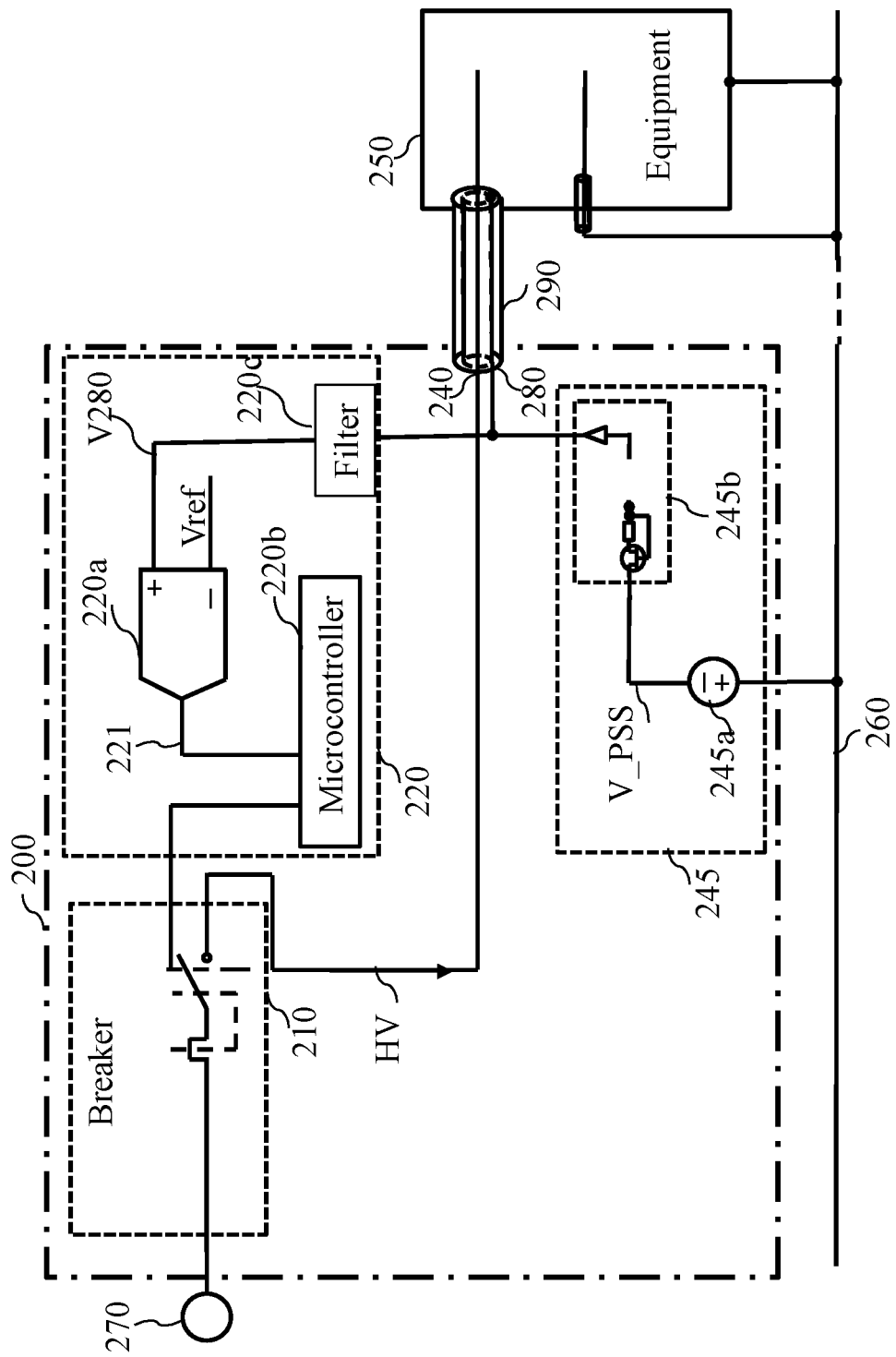
FIG. 4 shows a circuit diagram of the electrical installation shown in FIG. 2.

The electrical link 290 advantageously extends from the housing 12 as far as the user apparatus 250 (only a portion of the electrical link has been shown in FIG. 4).

FIG. 4 shows a biasing module 245 that comprises a DC voltage source 245a supplying a voltage V_PSS to provide the function of biasing the conductive sleeve 280, and a protective circuit, such as for example a bidirectional current limiter 245b, whose role is to allow the voltage on the conductive sleeve 280 to fluctuate. The voltage source 245a is connected between the current return line 260 and a first termination of the bidirectional current limiter 245b. The second termination of the bidirectional current limiter 245b is connected to the conductive sleeve 280.

The voltage V_PSS delivered by the voltage source 245a is lower in terms of absolute value than the voltage delivered by the electric power source 270, and it is given a value that is not hazardous to humans.

The sign of the voltage V_PSS delivered by the voltage source 245a is also preferably the reverse of that of the voltage HV delivered by the electric power source 270, to facilitate the detection of a change or of a current leak out of the electrical link 290. For example, the voltage V_PSS delivered by the voltage source 245a is −30 volts for a voltage HV of 540 volts.

The detection module 220 comprises a comparator 220a and a microcontroller 220b linking the output of the comparator 220a to the input of the circuit breaker 210. The microcontroller 220b receives an output signal VComp of the comparator 220a, and said microcontroller supplies a command signal to the circuit breaker 210.

The comparator 220a is connected, at a first input, to the conductive sleeve 280, and at a second input to a DC voltage generator (not shown) supplying what is termed a reference voltage Vref.

The comparator 220a compares the voltage V280 in the conductive sleeve 280 with the reference voltage Vref so as to detect a current leak out of the conductor 240. The output signal VComp of the comparator adopts two states, either a first state (for example 1 in Boolean logic), indicative of a current leak out of the electrical conductor 240, or a second state (for example 0) if there is no current leak.

The reference (Vref) voltage is chosen depending on the sign of the voltage HV delivered by the high-voltage power source 270 and depending on the sign of the voltage V_PSS.

In an example in which the high-voltage power source 270 produces a positive voltage and the voltage source 245a supplies a voltage V_PSS having a negative sign, the negative input of the comparator 220a is linked to a DC voltage generator that supplies the reference voltage Vref chosen to be greater than the voltage V_PSS delivered by the voltage source 245a. For example, the voltage Vref is equal to −25 volts for V_PSS at −30 volts. In this example, the output signal VComp 221 of the comparator changes from the second state to the first state (for example 1 in Boolean logic) when V280 is greater than Vref, and is in the second state (for example 0) when V280 is less than Vref.

As an option, the detection module 220 comprises a low-pass filter (active, passive or hybrid) 220c arranged on the electrical link between the conductive sleeve 280 and the input of the comparator 220a, so as to eliminate interference signals possibly present on the conductive sleeve 280 that could falsify the results of the comparisons performed by the comparator 220a.

Figure 5A:
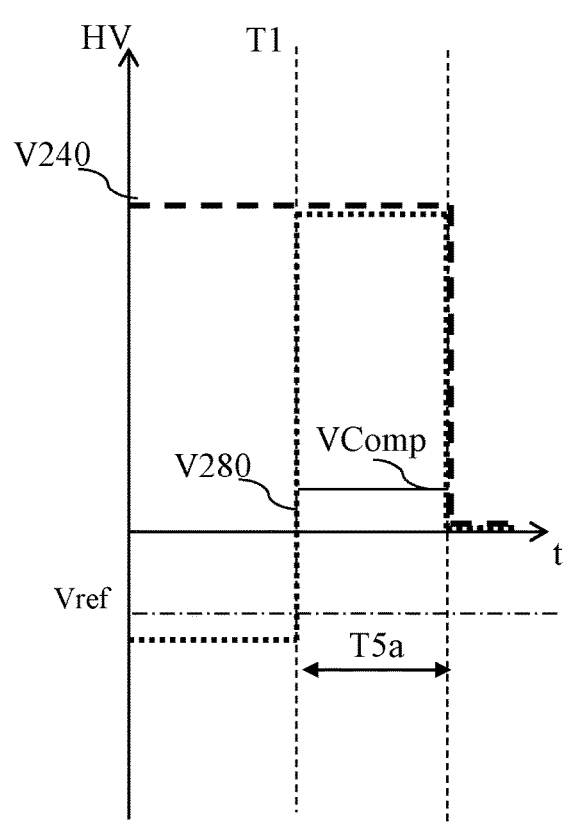
FIGS. 5a and 5b are diagrams illustrating the evolution of the voltages on the conductive sleeve according to FIG. 3 when the latter is current-biased.

FIG. 5a shows an example of the evolution of the signals Vref, V280, HV (the signal on the conductor 240) and VComp over time. Starting from a time T1, the electrical link 290 exhibits a fault (scenario of a fault with/breakage of the insulating cover 320 of the conductor 240) and a situation occurs whereby current leaks out of the conductor 240.

In this example, the high-voltage power source 270 produces a positive voltage HV:

HV=540 volts (the logic given below would be reversed for negative HV),

V_PSS=−30 volts,

Vref=−25 volts.

In FIG. 5a, starting from the time T1 and for a duration T5a, the conductive sleeve 280 is in contact with the conductor 240.

Before the time T1, the signal V280 on the conductive sleeve 280 is equal to the DC voltage V_PSS set to −30 volts and therefore greater in terms of absolute value than Vref1, which is set at −25 volts. The output signal VComp of the comparator 220a is therefore in its second state, for example at 0. The conductive sleeve 280 is not in contact with the conductor 240, or no electric arc exists between the conductive sleeve 280 and the conductor 240.

Past T1, and for the duration denoted T5a, the conductive sleeve 280 is in contact with the conductor 240 (either directly or through the formation of an electric arc). The signal V280 on the conductive sleeve 280 is equal to the voltage HV on the conductor 240 and is therefore greater than Vref. The output signal VComp of the comparator 220a therefore changes from the second state to its first state, for example changes from 0 to 1. The microcontroller 220b sends a signal to the circuit breaker 210 to interrupt current through the conductor 240.

After the duration T5a, the supply of electric power is interrupted and the voltage HV becomes zero.

The duration T5a is determined in such a way as to prevent possible interference pulses that could cause false detections.

Promptly after contact of the conductive sleeve 280 with the electrical conductor 240 is detected, the supply of electric power is interrupted after a brief reaction time T5a of the electronic circuits. The voltage-biased conductive sleeve 280 thus forms a detector that is capable of detecting damage to the electrical link 290. The fast cutting off (a few milliseconds) of the electric power prevents the creation/propagation of electric arcs and thus possible damage that could be inflicted on the surrounding materials through a thermal effect, and also prevents the injection of current into the surrounding materials and the propagation of the high voltage HV into other cables/conductors.

Figure 5B:
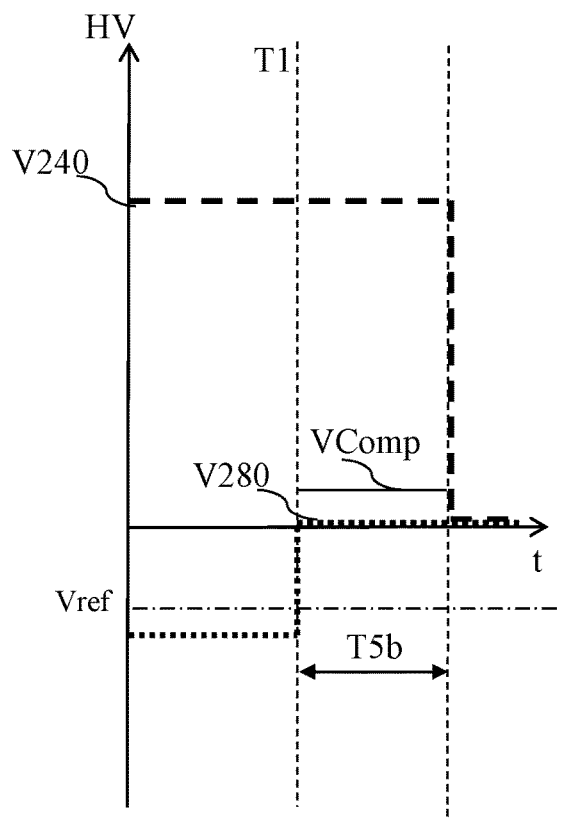

FIG. 5b shows an example of the evolution of the signals Vref, V280, HV (the signal on the conductor 240) and VComp over time when, starting from a time T1, the electrical link 290 enters into contact with the current return line 260 and exhibits a fault: scenario of a fault with/breakage of the insulating cover 310 of the conductive sleeve 280. This example shows that as soon as, e.g., within period T5b, the conductive sleeve 280 comes into contact with the current return line 260 or the conductive structure of the aircraft is detected, the supply of electric power is interrupted.

In this example, the high-voltage power source 270 produces a positive voltage HV:

HV=540 volts (the logic given below would be reversed for negative HV),

V_PSS=−30 volts,

Vref=−25 volts.

Starting from the time T1 and for a duration T5b, the conductive sleeve 280 is in contact with the current return line 260, the conductor 240 and the conductive sleeve being isolated from one another (no current leak out of the conductor).

Before the time T1, the signal V280 on the conductive sleeve 280 is equal to the DC voltage V_PSS of −30 volts and is therefore greater in terms of absolute value than Vref, which is set to −25 volts. The output signal VComp of the comparator 220a is therefore in its second state, for example at 0. The conductive sleeve 280 is not in contact with the return line 260, or no electric arc exists between the conductive sleeve 280 and the return line 260.

For the duration T5b, the conductive sleeve 280 is in contact with the current return line 260. The voltage V280 on the conductive sleeve 280 changes to the zero voltage, greater than Vref. The output signal VComp of the comparator 220a therefore changes from the second state to its first state, for example changes from 0 to 1. The microcontroller 220b sends a signal to the circuit breaker 210 to thus shut off the conductor 240.

After the duration T5b, the supply of electric power is interrupted and the voltage HV becomes 0.

Thus, when the voltage-biased conductive sleeve 280 is no longer able to perform its role of a detector capable of detecting damage to the electrical link 290, the conductor 240 is isolated so as to completely secure the electrical installation.

The duration T5b is determined in such a way as to prevent possible interference pulses that could cause false detections.

Figure 6:
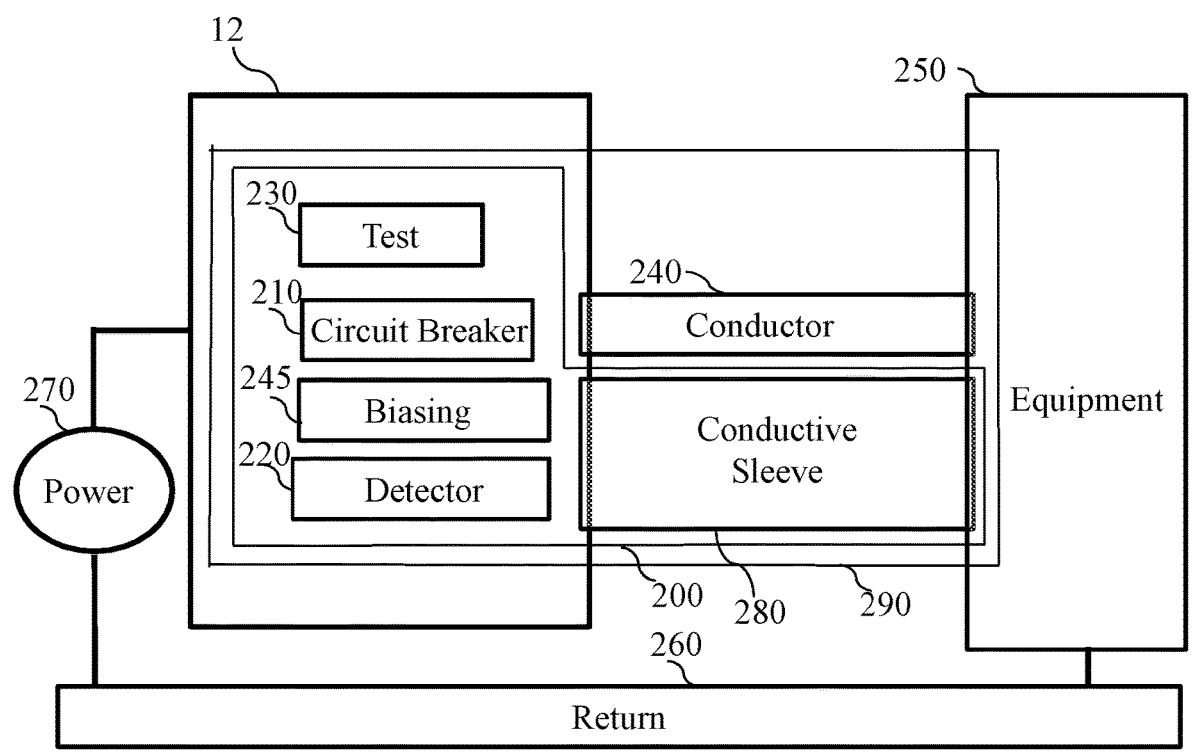
FIG. 6 is a view similar to FIG. 2, in which the device for the electrical protection of the conductor furthermore comprises a test module.
Figure 7:
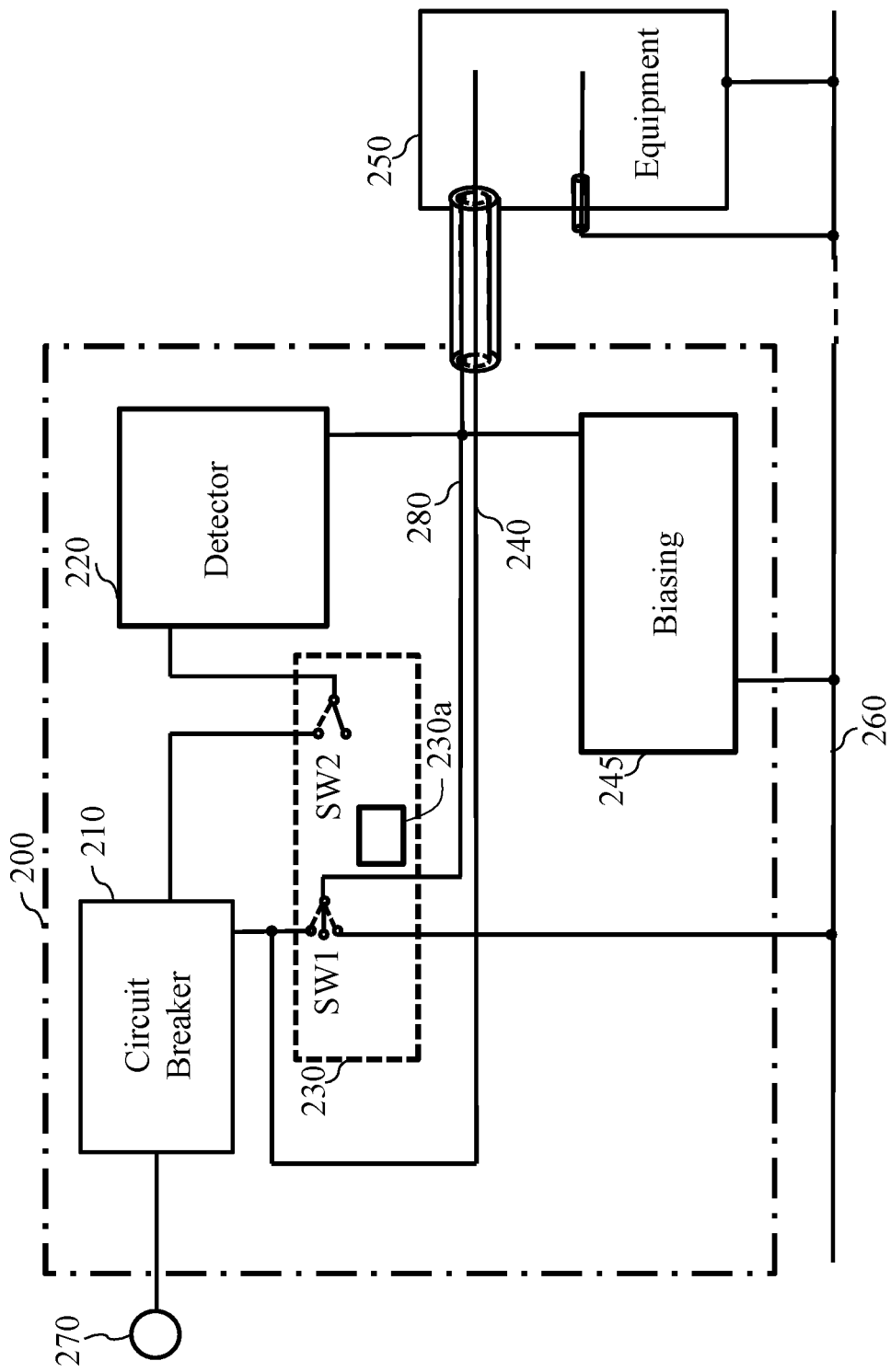
FIG. 7 shows a circuit diagram of the electrical installation shown in FIG. 6.

In one variant embodiment of the invention shown in FIGS. 6 and 7, the electrical protection device 200 furthermore includes a test module 230 that makes it possible to check the correct operation of the detection module 220. The test module 230 is, for example, formed of a central unit 230a associated with a first switch SW1 and with a second switch SW2.

The switch SW1 is connected to the input of the detection module 220 and is able to switch to three different terminals:

a first non-connected terminal (middle terminal of SW1 in FIG. 7); or a second terminal (upper terminal of SW1 in FIG. 7) linked to the conductor 240; or a third terminal (lower terminal of SW1 in FIG. 7) linked to the current return line 260.

The switch SW2 is connected to the output of the detection module 220 and is able to switch to two different terminals:

a first terminal linked to the central unit 230a such that it is only the central unit that receives the command signal from the microcontroller 220b; or a second terminal linked to the input of the circuit breaker 210 such that it is only the circuit breaker that receives the command signal from the microcontroller 220b.

The central unit 230a is configured to control the switches SW1, SW2 and to implement a first and second test program at regular intervals.

When the central unit 230a is not implementing the test program, the switch SW1 switches to its first terminal and the switch SW2 switches to its second terminal.

When the central unit 230a implements the first test program, the switch SW1 switches to its second terminal so as to connect an input of the detection module 220 with the conductor 240 (in order to force the output signal VComp of the comparator 220a to change from the second state to the first state, scenario of FIG. 5a for example) and the switch SW2 switches to its first terminal so as not to activate the circuit breaker 210 while the test is being implemented. Only the microcontroller receives a signal from the detection module 220 and is able to check whether the latter is operative, that is to say has indeed generated an order to activate the circuit breaker 210 during the test. If, at the end of a predetermined test time, the detection module 220 has not generated an order to interrupt the supply of electric power, the central unit 230a of the test module 230 emits an alert intended for an operator. In response to the alert, the operator may choose to maintain the supply of electric power until the end of the flight or to quickly bring about the interruption of the supply of electric power by actuating a circuit breaker in the aircraft's cockpit. A technician will later have to repair the detection module 220 in order for the system for securing the supply of electric power to become operational again.

When the central unit 230a implements the second test program, the switch SW1 switches to its third terminal to connect an input of the detection module 220 with the current return line 260 (in order to force the output signal VComp of the comparator 220a to change from the second state to the first state, scenario of FIG. 5b for example) and the switch SW2 switches to its first terminal so as not to activate the circuit breaker 210 while the test is being implemented. Only the central unit 230a receives a signal from the detection module 220 and is able to check whether the latter is operative, that is to say has indeed generated an order to activate the circuit breaker 210. If, at the end of a predetermined test time, the detection module 220 has not generated an order to interrupt the supply of electric power, the central unit 230a of the test module 230 emits an alert intended for an operator. The operator may choose to maintain the supply of electric power until the end of the flight or interrupt the supply of electric power by actuating a circuit breaker in the aircraft's cockpit. A technician will later have to repair the detection module 220 in order for the system for securing the supply of electric power to become operational again.

In the above description, current return line 260 is understood to mean either a return conductor or a current return network. If the current return line 260 is a conductor set to a voltage different from that of the conductive structure of the aircraft, then an electrical protection device such as described above will have to be associated with the current return line 260 in order to secure the current return.

The invention has been described for the purpose of protecting the transmission of electric power via an electrical link of an electrical installation on an aircraft 10. However, the invention is applicable to any other type of vehicle, for example a boat or an automobile.

The invention has been described, in particular through the examples illustrated in FIGS. 5a and 5b, for a positive voltage HV and a negative voltage V_PSS. It is within the scope of those skilled in the art to modify the invention so as to take account of other parameters (positive or negative voltage HV, positive or negative voltage V_PSS).

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention is:

1. An electrical link configured to link a power source to a user apparatus, the electrical link including an electrical conductor surrounded by an insulating cover and an electrical protection device, wherein the electrical production device comprises:
    a conductive sleeve arranged around the insulating cover,
    a biasing module configured to voltage-bias the conductive sleeve,
    a circuit breaker in series with the conductor and configured to, upon command, interrupt current through the conductor, and
    a detection module connected to the conductive sleeve and configured to detect a current leaking from conductor and, in response to a detected leak, command the circuit breaker to interrupt current through the conductor;
    wherein the power source is a high-voltage direct-current power source, and
    wherein the biasing module is configured to apply to the detection module a bias voltage having an opposite polarity sign to the voltage provided by the high-voltage direct-current power source.

2. The electrical link according to claim 1, wherein the detection module comprises:
    a comparator including a first input connected to the conductive sleeve and a second input connected to a reference voltage supplied by a DC voltage generator; and
    a microcontroller receiving output signals from the comparator and generating a command signal to the circuit breaker, wherein the microcontroller is configured to send a command signal to the circuit breaker to cause the circuit breaker to interrupt current in the conductor depending on the output signals received from the comparator.

3. The electrical link according to claim 1, wherein the biasing module comprises a DC voltage source and a bidirectional current limiter.

4. The electrical link according to claim 2, further comprising a test module configured to test the detection module, wherein the test module comprises:
    a central unit configured to command switching of a first switch and a second switch;
    wherein the first switch is connected to the first input of the comparator and switches between a first non-connected terminal, a second terminal linked to the electrical conductor, and a third terminal linked to a current return line,
    wherein the second switch is connected to the output of the microcontroller of the detection module and switches between a fourth terminal linked to the central unit such that only the central unit receives the command signal from the microcontroller while the second switch is at the fourth terminal, and a fifth terminal linked to the circuit breaker such that only the circuit breaker receives the command signal from the microcontroller while the second switch is at the fifth terminal;

wherein the central unit is configured implement a test mode by switching the first switch to the second terminal and the second switch to the fourth terminal and thereafter monitor a change of state of the control signal of the microcontroller; and wherein the central unit is configured to implement an out of test phase by switching the first switch to the first terminal and control the second switch to switch to the fifth terminal.

5. The electrical link according to claim 1, wherein the detection module comprises a low-pass filter arranged in services between the conductive sleeve and the first input of the comparator.

6. The electrical link according to claim 1 further comprising an insulating cover surrounding the conductive sleeve.

7. A method for the secure supply of electric power to a user apparatus in a vehicle via an electrical link linking the user apparatus to a power source, the electrical link comprising:
  an electrical conductor surrounded by an insulating cover;
  an electrical protection device comprising:
   a conductive sleeve arranged around the insulating cover;
    a biasing module configured to apply a voltage-bias the conductive sleeve;
    a circuit breaker arranged on the conductor and configured to cut off a current transiting through the conductor; and
    a detection module comprising a comparator with a first input connected to the conductive sleeve and a second input connected to a reference voltage supplied by a DC voltage generator, and a microcontroller connected between an output of the comparator and the circuit breaker, the microcontroller being configured to send a command signal to the circuit breaker on the basis of an output signal received from the comparator, wherein the method comprises the following successive steps of:

injection, by the biasing module, of a DC voltage into the conductive sleeve;

comparison, by the comparator, of a voltage on the conductive sleeve and the reference voltage;

monitoring, by the microcontroller, of the state of the output signal of the comparator, said state being either a first state indicative of a current leak out of the electrical conductor or a second state if not;

activation of the circuit breaker by the microcontroller if the output signal of the comparator is in the first state, wherein the power source is a high-voltage direct-current power source and the biasing module applies a DC voltage with a polarity opposite to a polarity of a DC voltage supplied by the power source to the conductor.

8. The method according to claim 7, wherein the detection module further comprises a test module, the test module including a central unit controlling switching of a first switch and a second switch;

wherein the first switch switches between a first terminal connected to the first input of the comparator, a second terminal which not connected to a current source, and a third terminal connected to the electrical conductor;

wherein the second switch switches between a fourth terminal establishing a connection between the output of the microcontroller of the detection module and the circuit breaker, and a fifth terminal establishing a connection between the output of the microcontroller of the detection module and the central unit and isolating the circuit breaker from the output of the microcontroller;

wherein the method further comprises a test step, implemented for a predetermined time during which the central unit commands the first switch to switch to the second terminal and commands the second switch to the fifth terminal and thereafter the central unit monitors a change of state of the command signal from the microcontroller; and wherein, while the test step is not performed, the central unit commands the first switch to switch to the first terminal and commands the second switch to switch to the fourth terminal.

* * * * *